United States Patent [19]
Lindsey et al.

[11] Patent Number: 5,337,214
[45] Date of Patent: Aug. 9, 1994

[54] BYPASS CONTACTOR FOR SOLID STATE MOTOR STARTERS

[75] Inventors: Kurt L. Lindsey, New Berlin; Andrew R. Peret, Milwaukee; Jerome K. Hastings, Sussex; Richard G. Smith, Caledonia, all of Wis.

[73] Assignee: Eaton Corporation, Cleveland, Ohio

[21] Appl. No.: 55,590

[22] Filed: May 3, 1993

[51] Int. Cl.$^5$ .............................. H05K 7/20
[52] U.S. Cl. .................. 361/709; 174/16.3; 257/713; 335/135; 361/712; 363/141
[58] Field of Search ............ 361/689, 690, 704, 707, 361/709, 712, 717, 718; 310/64, 68 D; 174/16.3; 318/370–376; 388/860, 937; 165/80.3, 185; 257/713, 718, 719, 723, 727, 724; 363/141, 144; 335/135, 202

[56] References Cited

U.S. PATENT DOCUMENTS

| | | | |
|---|---|---|---|
| 4,159,483 | 6/1979 | Bettin | 357/79 |
| 4,760,364 | 7/1988 | Ostby | 335/132 |
| 4,809,153 | 2/1989 | Bremer et al. | 363/141 |
| 4,943,890 | 7/1990 | Schaltenbrand et al. | 361/388 |

Primary Examiner—Gerald P. Tolin
Attorney, Agent, or Firm—Larry G. Vande Zande

[57] ABSTRACT

A bypass contactor usable in a solid state motor starter for shunting current around a fully-conducting solid state switching device comprising an electromagnetic contactor housed in a molded insulating enclosure having a plurality of bridging contacts movable into and out of engagement with a pair of stationary contacts to provide plural parallel current paths within the contactor, the stationary contacts having rigid terminal portions projecting externally of the insulating enclosure connectable to the heat sinks of the solid state motor starter in a preferred manner to suspend the contactor above the panel, permitting other components to be mounted below the bypass contacts. Alternate embodiments have the contactor mounted to the same support as the starter power pole component assembly and electrically connected thereto by rigid preformed connectors or flexible braided straps. Also contemplated is increasing the rated current handling capacity by mounting a pair of the bypass contactors to the heat sinks in parallel to double the parallel current paths.

9 Claims, 3 Drawing Sheets

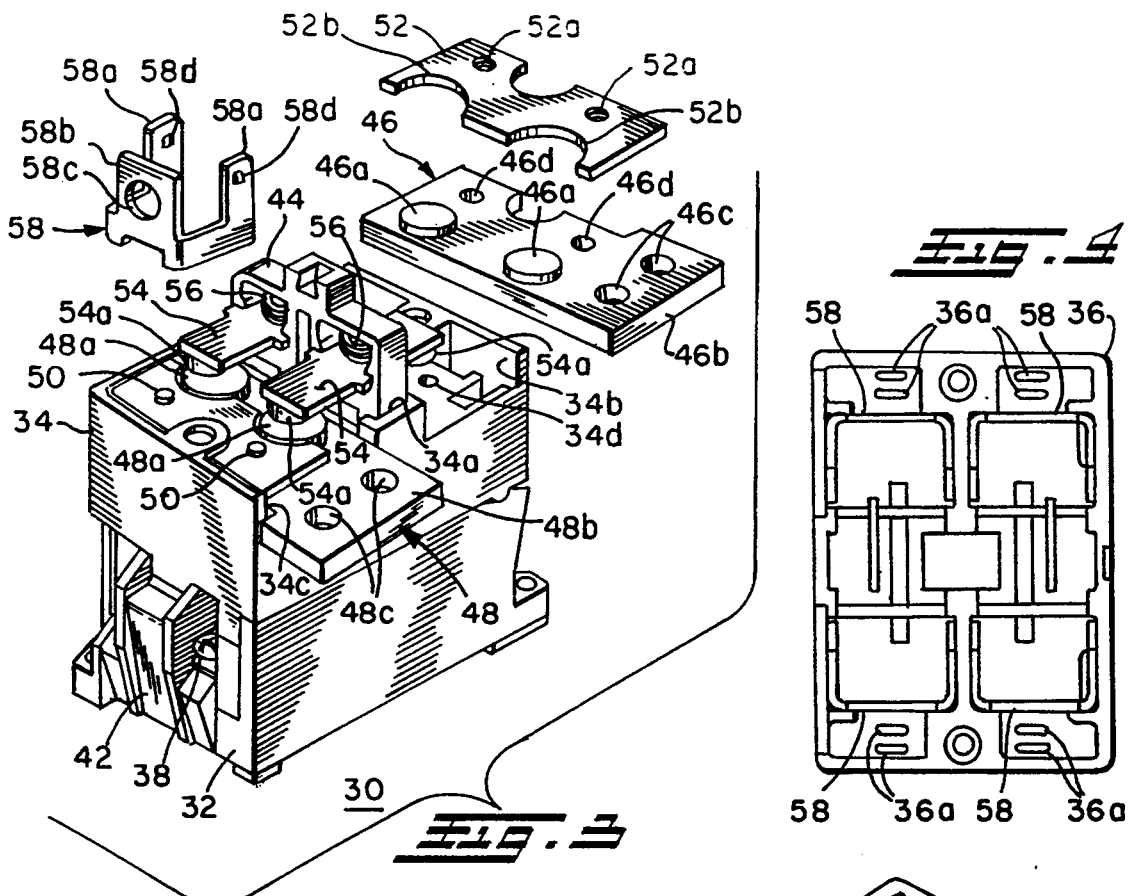
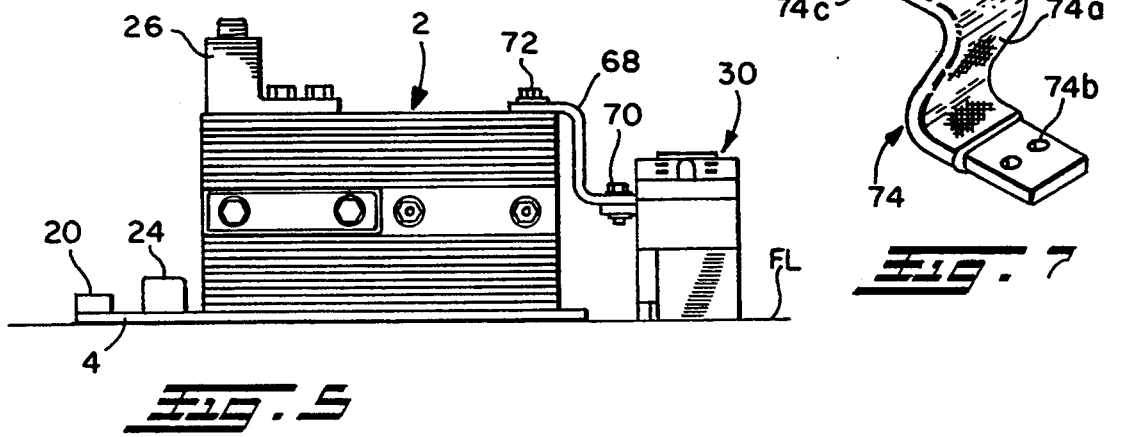
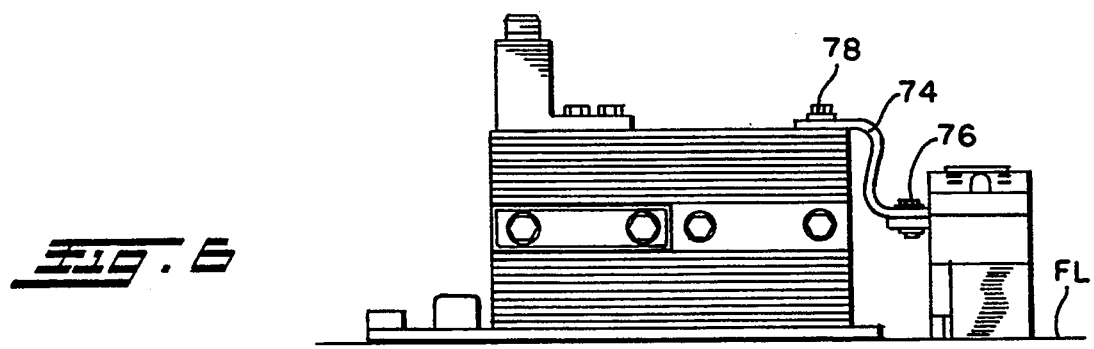

BYPASS CONTACTOR FOR SOLID STATE MOTOR STARTERS

BACKGROUND OF THE INVENTION

Solid state motor starers control the stopping and staring of electrical motors by gated semiconductor devices such as SCRs or other thyristors. A concern in solid state motor starers is the amount of heat generated by the semiconductor switching devices particularly when the motor is running between start-up and stopping operations. This problem becomes more acute as the enclosures for such control are made more compact and/or contain more equipment.

One method of minimizing the heat generated by solid state motor starter systems is to employ an electromagnetic by-pass contactor electrically connected in parallel with the semiconductor switching device(s) for each phase of the starter. The semiconductor switching device is commonly clamped between a pair of heat sinks which are in electrical circuit with the respective semiconductor switching device. Accordingly, the by-pass contactor is commonly wired to the heat sinks by providing electrical connector lugs on the heat sinks. The size wire required for such applications is quite large and therefore the bending radius for the wire is similarly very large. Each phase, or pole, of a solid state motor starter requires a bypass contactor. Accordingly, the size and quantities of contactors required and the large wire bending area occupy considerable space within the enclosure. As stated above, it is a trend in present day motor starter design to reduce the overall size of the starter, hence the enclosure, which requires the individual components of the starter to be smaller in size and more closely arranged within the enclosure.

SUMMARY OF THE INVENTION

This invention provides a compact electromagnetic contactor particularly well suited for bypass contactor application. It comprises an enclosure molded of insulating material housing an electromagnet and the contact structure. It employs plural double break bridging contacts operating in parallel on a pair of stationary contacts common to the respective bridging contacts. The stationary contacts are made of substantial mass and rigidly attached within the contactor enclosure to withstand large currents and dissipate heat within the contact. Rigid terminal portions of the stationary contacts project externally of the contactor enclosure to enable the contactor to be connected to the heat sinks by connector straps and in one preferred embodiment, to permit the contactor to be supported in suspended manner from the heat sinks. In an alternative embodiment preformed bus conductor straps are provided for interconnecting the contactor terminals to the heat sinks. In still another preferred embodiment a resilient or flexible braided conductor is utilized to interconnect the contactor terminals and heat sinks. It is also contemplated in this invention that a pair of the bypass contactors may be used in parallel with the heat sinks to handle higher current ratings. These and other features and advantages of the invention will become readily apparent in the following description and claims when read in conjunction with the accompanying drawings.

BRIEF DESCRIPTION OF THE DRAWINGS

FIG. 3 is an exploded isometric view of the bypass contactor of this invention with the cover removed and not illustrated.

FIG. 4 is a bottom plan view of the cover of the bypass contactor of this invention.

FIG. 5 is a side elevation view of a power pole assembly similar to FIG. 2 but drawn to a reduced scale showing an alternative mounting and connection means of the bypass contactor to the heat sinks.

FIG. 7 is a perspective view of a connector strap utilized in the embodiment illustrated in FIG. 6.

FIG. 8 is a side elevation view similar to FIG. 2 showing an alternative embodiment having two bypass contactors connected to the heat sinks in parallel.

DETAILED DESCRIPTION OF THE PREFERRED EMBODIMENT

Figure 1:
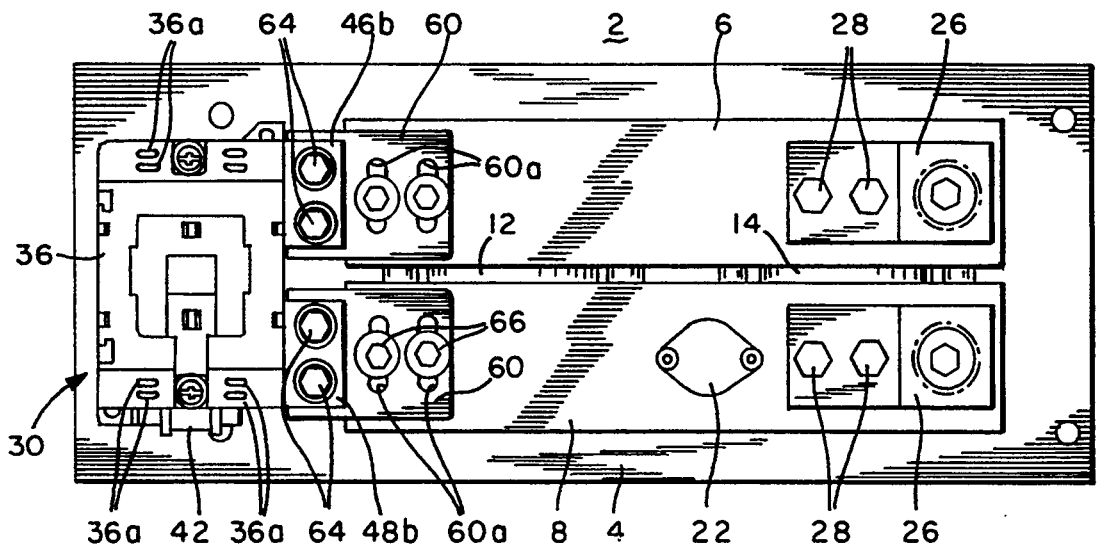
FIG. 1 is a top plan view of a single power pole assembly for a solid state motor starter employing the bypass contactor of this invention.
Figure 2:
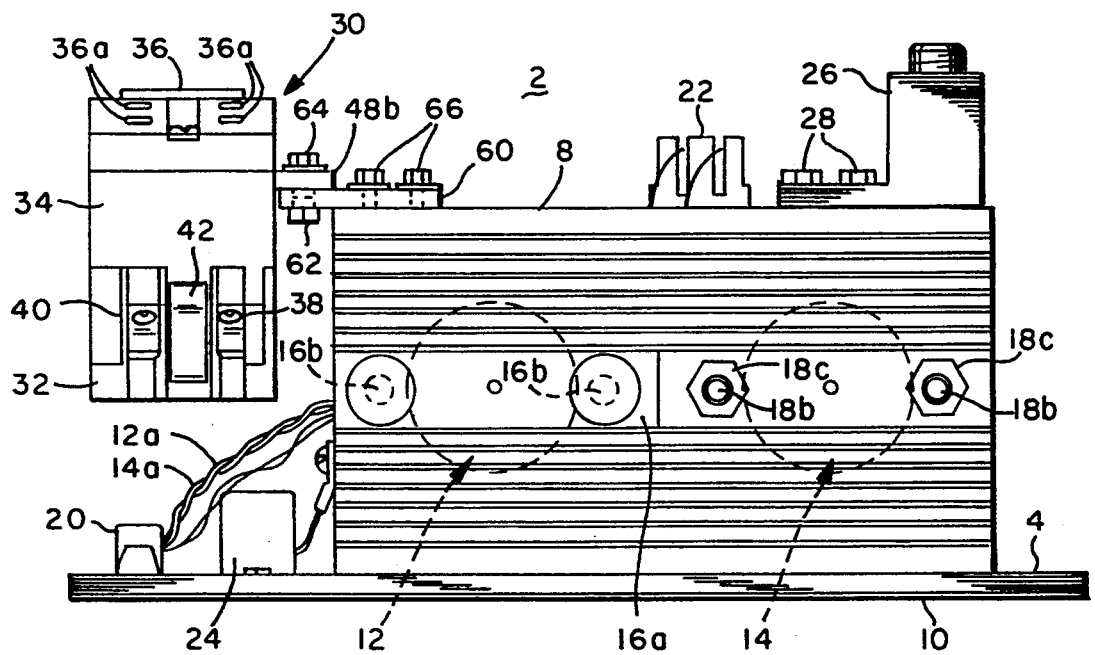
FIG. 2 is a side elevation view of the power pole assembly shown in FIG. 1.

Referring to the drawings, FIG. 1 shows a single power pole assembly 2 of a solid state motor starter. The assembly 2 comprises an insulating panel 4 having one of a pair of extruded aluminum heat sinks 6 and 8 mounted thereon by screws (not shown) which extend up through holes in the panel 4 and take into threaded openings in the bottom of the respective heat sink. A thin insulating member 10 is affixed to the bottom of panel 4 to cover the heads of the screws which hold the heat sink to the panel. A pair of gate controlled semiconductor power switching devices 12 and 14 are clamped between heat sinks 6 and 8 by a pair of semiconductor clamp assemblies 16 and 18 (FIG. 2). Clamp assemblies 16 and 18 typically comprise a cross bar such as at 16a having a pair of threaded posts 16b, 18b extending from opposite ends of the cross bar through openings in the heat sinks on opposite sides of the semiconductor switching devices 12 and 14 to receive a pair of nuts such as 18c threaded onto the projecting ends of the respective posts at the opposite side of the heat sinks. Many such clamping assemblies are commercially available. Some variations of semiconductor clamps also utilize a clamping bar on the side receiving the nuts. For a more complete understanding of the semiconductor clamps and the method of clamping the semiconductor switching devices between the heat sinks, reference may be had to U.S. Pat. No. 4,159,483 issued to Carl J. Bettin on Jun. 26, 1979 and assigned by mesne assignments to the assignee of this invention, which patent is hereby incorporated herein by reference.

Power pole assembly 2 also comprises a terminal block 20 attached to panel 4 for connection of gate control wires 12a and 14a of semiconductor switching devices 12 and 14 thereto. Also, a thermal switch 22 is secured to the top surface of heat sink 6 or 8 and the wire leads from switch 22 are disposed between the heat sinks 6 and 8 and brought out to the terminal block 20 for attachment thereto. A snubber capacitor 24 is also attached to the panel 4 and has wire leads connected to each of the heat sinks 6 and 8 to protect the semiconductor switching devices 12 and 14 from voltage transients. Wire lug connectors 26 are attached to the top surfaces of heat sinks 6 and 8 respectively by pairs of screws 28 for connection of load and line power conductors to the power pole assembly 2.

In application, a plurality of power pole assemblies 2 are mounted within an enclosure and the line and load conductors for the respective phases of the motor starter apparatus are connected to the respective power pole assembly 2 by connectors 26. Control circuitry for the semiconductor switching devices 12 and 14 is connected to the appropriate wires 12a and 14a at the terminal block 20. The semiconductor switching devices 12 and 14 are rendered conductive or non-conductive by appropriate gating control circuitry (not shown). In the conductive state, current is conducted from one connector 26, through heat sink 6 and the respective semiconductor switching devices 12 and 14 to heat sink 8 and the other connector 26. Between startup and stopping of the motor (conduction and non-conduction of the semiconductor switching devices 12 and 14) continuous current is conducted by the semiconductor switching devices 12 and 14 which generate a substantial amount of heat. To minimize the amount of heat that has to be dissipated from the motor starter enclosure, bypass contactors 30 are employed to shunt the semiconductor switching devices 12 and 14 once they are fully conductive until a time prior to that at which the devices 12 and 14 are to be non-conductive. The electromagnetically operated bypass contactor 30 is electrically connected to the respective heat sinks 6 and 8 in parallel with the semiconductor switching devices 12 and 14. When energized, current is conducted through the contacts of the bypass contactor 30 in shunt of the semiconductor switching devices 12 and 14.

The bypass contactor 30 of this invention is very similar to the contactor shown and described in U.S. Pat. No. 4,760,364 issued to Marvin E. Ostby on Jul. 26, 1988 and assigned to the assignee of this invention, which patent is hereby incorporated herein by reference. The bypass contactor 30 has a molded insulating enclosure which comprises a lower housing 32, an upper housing 34 and a cover 36. An electromagnet assembly (not shown) is contained within the enclosure between the lower housing 32 and the upper housing 34. The electromagnet assembly includes a coil having coil wire terminations 38 and 40 projecting externally of lower housing 32 at one end of the enclosure. An armature (not shown) is also disposed within the contactor enclosure between the lower housing 32 and upper housing 34, the armature being spring biased away from the electromagnet. The upper housing 34 is attached to lower housing 32 by a pair of lugs (not shown) on upper housing 34 hooked into appropriate corresponding openings (not shown) in lower housing 32 at one end of the enclosure and by attaching a clip 42 pivotally connected to lower housing 32 over a ledge on upper housing 34 at the opposite end of the enclosure. A movable contact carrier 44 (FIG. 3) is guided for reciprocal movement within the enclosure defined by upper housing 34 and lower housing 32 and as seen in FIG. 3 projects through an opening 34a in the upper surface of upper housing 34. Contact carrier 44 is connected to the electromagnet armature, and therefore the spring biasing the armature away from the electromagnet biases the contact carrier 44 to an extended position with respect to the upper housing 34. Energization of the electromagnet attracts the armature thereto and moves the contact carrier 44 to a retracted position relative to upper housing 34.

The upper portion of housing 34 is modified over that of the contactor disclosed in U.S. Pat. No. 4,760,364. The upper surface of upper housing 34 has a pair of generally planar recessed shelves disposed on opposite sides of the opening 34a and communicating with openings 34b and 34c in one sidewall of upper housing 34. A pair of stationary contacts 46 and 48 are made from relatively thick copper bar stock, on the order of one-quarter inch thickness. Contacts 46 and 48 are identical except for the placement of contact elements 46a and 48a attached to the respective stationary contact members, wherein the member 46 is flipped 180 degrees with respect to member 48 to make a right and left-hand stationary contact. Two contact elements 46a and 48a are positioned on each of the stationary contacts 46 and 48. Terminal portions 46b and 48b, respectively, extend through the openings 34b and 34c to the exterior of the enclosure of bypass contactor 30, each of the terminal portions having a pair of holes 46c and 48c, respectively, therethrough for attachment of an electrical connection member to be later described. A pair of screws 50 extend upward through holes in the shelf portions of upper housing 34, one of which holes 34d is visible in FIG. 3. Screws 50 pass through clearance holes in the respective stationary contact members, such as hole 46d shown in stationary contact 46 in FIG. 3, to take into threaded holes 52a in a contact mounting plate 52 which overlies the respective stationary contact and clamps it against the shelf surface. The plate 52 is made of steel and has semicircular cutouts 52b formed along one edge that partially surround the respective contact elements 46a or 48a, but are spaced therefrom. The plate 52 additionally serves as an arc runner for attracting any arc drawn between the stationary contact elements and respective movable contact elements away from the same. A pair of movable bridging contacts 54 are mounted in the contact carrier to extend out opposite sides thereof. A movable contact element 54a is attached to the lower surface of each movable contact member 54 at each end thereof to align with the respective stationary contact elements 46a and 48a. Springs 56 bias movable contacts 54 against a lower edge of a window in the contact carrier in which the respective movable contacts are mounted and provide contact pressure for the contacts when the contactor is operated to its contact closed position. Attraction of the armature to the electromagnet causes retraction of the contact carrier and movement of the movable contact elements 54a into bridging engagement with respective stationary contact elements 46a, 48a.

Since in usual service the bypass contactor 30 is expected only to carry current after a parallel circuit has been established in the solid state power pole, and is not intended to make or break the circuit, it is of greater significance that the contacts be of appropriate mass to handle large currents than to incorporate a design that can withstand arcing. Thus the contact structure of the bypass contactor 30 is of substantially heavy duty construction and large mass. The dual parallel current paths established by the two bridging contacts 54 effectively divide in half the current that is handled by each contact set. Nevertheless, arc blowouts 58 are provided in the cover 36 to surround the respective contact elements to direct any arc drawn between a movable contact element 54a and a respective stationary contact 46a or 48a away therefrom. The blowout member 58 is a U-shaped steel member (FIG. 3) having projections 58a at the distal ends of the legs extending at right angles to the legs and having a central tab 58b at the bight portion extending parallel to the projections 58a. A large hole 58c is provided in the central tab 58b. The ends of projections 58a are provided with outwardly flared sheered tabs 58d which engage in suitable depressions in the cover 36 to hold the blowout member 58 in place within the cover (FIG. 4). As can be seen in FIG. 4, there are four blowout members 58 positioned in the cover, one at each of the contact locations. The cover is also provided with a pair of slots open through the upper surface at each of the four locations of the blowout members for venting are gasses through the cover to the exterior of the contactor. As earlier described, the bypass contactor does not normally make or break the current; this is normally handled by the gated semiconductor switching device. However, in the event the system malfunctions and the contactor is required to open while current is flowing, the blowout structures 58, plates 52, and vents 36a will dissipate the arc generated.

FIG. 2 shows a preferred embodiment of electrically connecting the bypass contactor 30 to the solid state power pole 2. A pair of heavy duty conductive connector plates 60 on the order of one-quarter inch thick copper are provided with a pair of holes that correspondingly align with the holes 46c and 48c in terminal portions 46b and 48b of stationary contacts. The holes in the connector plates 60 may be provided with plug nuts 62 (FIG. 2) pressed in from the bottom of electrically connecting the bypass contactor 30 to the solid state power pole 2. A pair of heavy duty conductive connector plates 60 on the order of one-quarter inch thick copper are provided with a pair of holes that correspondingly align with the holes 46c and 48c in terminal portions 46b and 48b of stationary contacts. The holes in the connector plates 60 may be provided with plug nuts 62 (FIG. 2) pressed in from the bottom surface thereof to receive the threaded shank of screws 64 which firmly secure the connector straps 60 to the terminal portions 46b and 48b. The opposite ends of connector straps 60 have a pair of transversely extending elongated slots 60a through which screws 66 extend to take into corresponding threaded holes in the upper surfaces of respective heat sinks 6 and 8. The slots 60a accommodate large variations in the spacing of the heat sinks 6 and 8 due to different size semiconductor switching devices. When the screws 66 are securely tightened, the bypass contactor 30 is suspended off one end of the power pole assembly 2, permitting the space below the bypass contactor on panel 4 to be used for the terminal block 20 and the capacitor 24. Contactor 30 has mounting holes and feet formed in the lower housing member 32 for direct base mounting of the contactor. A U-shaped bracket may be fitted in an inverted manner on panel 4 to straddle the terminal block 20 and capacitor 24, providing a platform to which contactor 30 can be mounted.

Figure 6:
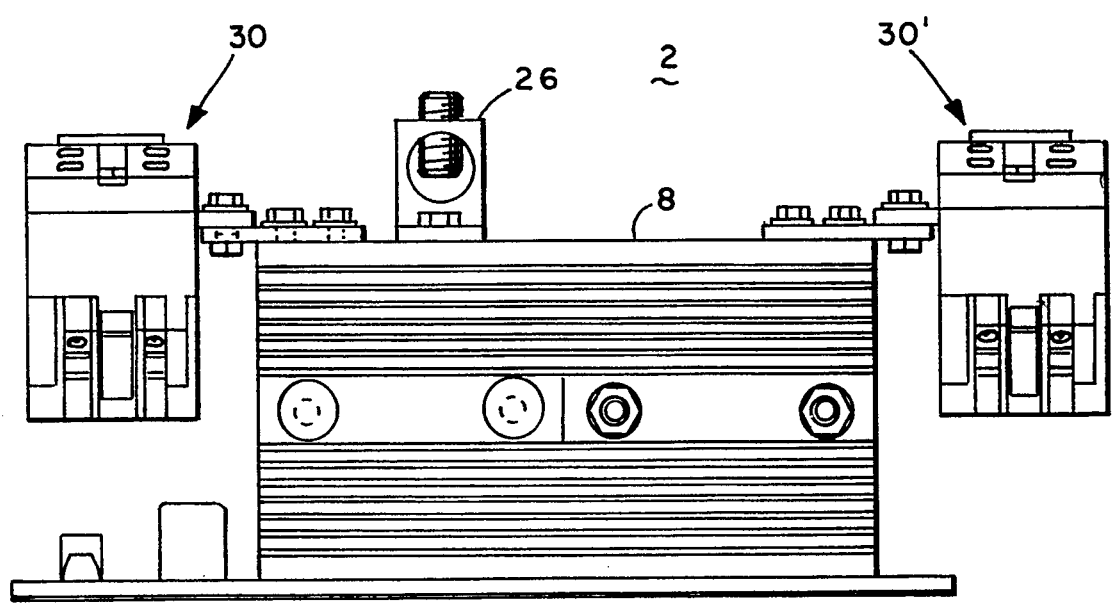
FIG. 6 is a side elevation view of the power pole assembly similar to FIG. 2 but drawn to a reduced scale showing another alternative connection means of the bypass contactor to the heat sinks.

FIGS. 5 and 6 show alternative forms of mounting the bypass contactor 30 relative to the power pole assembly 2. In these figures, the bypass contactor 30 is mounted to the solid state starter enclosure as represented by the floor line FL in common with the power pole assembly. It should be noted that the contactor 30 is mounted at the opposite end of the power pole assembly 2 from the connector block 20 and capacitor 24 and that the connector lug 26 is now mounted at the end of the heat sinks adjacent connector block 20 and capacitor 24. In FIG. 5, a rigid, preformed Z-shaped electrical connector strap 68 is attached to the terminal portions of the stationary contacts of contactor 30 and to the top surface of the respective heat sinks 6 and 8 by appropriate screws 70 and 72. In FIG. 6, a flexible flat braided conductive strap 74 is connected between the bypass contactor terminals and the top surface of the respective heat sinks by screws 76 and 78. The connector strap 74, which may be of the type "BXB" manufactured and sold by Delta Star Inc. of Linchberg, Va., comprises a braided copper web 74a having end pads 74b and 74c secured thereto at opposite ends of the web. The end pads are provided with suitable slots and holes for attachment to the heat sinks and to the terminal portions as aforedescribed. The flexible strap has particular advantage where the tolerances for mounting the bypass contactor and the heat sink power pole assembly are unlikely to be close enough to permit the rigid preformed conductor 68 to be used. Mismatch between semiconductor devices, uneven mounting surfaces for the heat sinks, misalignment of mounting holes and other factors can cause the attachment surfaces for the connector straps on the heat sinks to be rotationally or orthogonally askew along as many as three axes each. Attachment of the contactor directly to the heat sinks in a misaligned condition can create a mechanical loading of the contactor. The different types of connector straps accommodate some or all of such misalignment conditions. For example, the flat, rigid straps 60 have transversely extending slots 60a for accommodating lateral variation between the heat sinks. The width of the slots also permit some rotation in the plane of the heat sink surfaces. This type of Connector is unaffected by vertical variations in the heat sink surfaces, as long as one does not vary with respect to the other which would then create a rotational variation about an axis extending into the contactor between the terminal portions. The flexible braided connector permits misalignment and orthogonal or rotational translation in all six axes without mechanically loading the contactors.

The bypass contactor 30 has two double break paths for handling relatively large current. However, it is possible to increase the current rating by mounting a second bypass contactor 30' to the power pole assembly 2 as shown in FIG. 8. In this case the second contactor is mounted at the opposite end of the power pole heat sinks and the wire lugs 26 are moved to the middle of the heat sinks and directed laterally outward thereof. By operating both contactors 30 and 30' simultaneously, four parallel current paths can be utilized to divide and direct the current in shunt of the semiconductor switching devices.

The foregoing has described a bypass contactor for a solid state motor starter wherein an electromagnetic contactor having a molded, insulating enclosure provides two heavy duty current paths in a single pole contactor. The contactor may be supported directly from the heat sinks of the solid state starter power pole assembly or it may be mounted to a cabinet in common with the power pole assembly and electrically connected to the power pole assembly by preformed rigid conductor straps or by a flexible braided connector strap. While the invention is shown in its preferred embodiments, it is to be understood that it is susceptible of various modifications without departing from the scope of the appended claims.

We claim:

1. In a solid state motor starter comprising at least one solid state power switching device clamped between a pair of heat sinks, said heat sinks being electrically in circuit with said solid state power switching device, and a discrete electromagnetically operated switching device adapted to be electrically connected to said heat sinks in parallel with said solid state power switching device, said discrete electromagnetically operated switching device comprising an insulating enclosure containing an electromagnet, an armature, and a contact carrier, said contact carrier being connected to said armature and said armature being biased away from said electromagnet, the improvement comprising:

a pair of stationary contacts mounted in said insulating enclosure, each stationary contact having a plurality of stationary contact elements mounted thereon, said stationary contacts comprising terminal portions extending externally of said insulating enclosures said terminal portions being sufficiently sturdy to support said switching device thereby;

a plurality of movable contacts resiliently connected to said contact carrier within said insulating enclosure in corresponding alignment with respective pairs of said stationary contact elements said movable contacts each having a pair of movable contact elements affixed thereon respectively engageable with corresponding said stationary contact elements when said armature is attracted to said electromagnet for electrically bridging said stationary contacts in plural parallel paths; and means mechanically and electrically connecting said extending terminal portions directly to said heat sinks.

2. The solid state motor starter defined in claim 1 wherein said electromagnetically operated switching device comprises arc reduction means in said enclosure proximate said stationary contact elements.

3. The solid state motor starter defined in claim 1 wherein said means electrically connecting said terminal portions to said heat sinks comprise rigid connector straps securely fastened to said terminal portions, said connector straps having elongated slots through which fastener means secure said connector straps to said heat sinks, said slots accommodating variation in spacing between said heat sinks.

4. The solid state motor starter defined in claim 3 wherein said connector straps accommodate misalignment of said heat sinks along at least two orthogonal axes and at least one rotational axis.

5. The solid state motor starter defined in claim 3 wherein said connector straps and said terminal portions support said electromagnetically operated switching device in a suspended condition from said heat sinks.

6. The solid state motor starter defined in claim 1 wherein said means electrically connecting said terminal portions to said heat sinks comprise rigid connector straps securely fastened to said terminal portions, said connector straps and said terminal portions securely attaching said contactor to said heat sinks in a suspended condition from said heat sinks.

7. The solid state motor starter defined in claim 3 wherein said heat sinks and said electromagnetically operated switching device are independently mounted on support means and said connector straps are rigid preformed members.

8. The solid motor starter defined in claim 1 wherein said means electrically connecting said terminal portions to said heat sinks rigidly secures said discrete electromagnetic switching devices in a suspended condition from said heat sinks.

9. In a solid state motor starter comprising at least one solid state power switching device clamped between a pair of heat sinks, said heat sinks being electrically in circuit with said solid state power switching device, a bypass contactor arrangement electrically connected to said heat sinks in parallel with said solid state power switching device comprising:

a pair of discrete electromagnetically operated switching devices each comprising a molded insulating enclosure containing an electromagnet, an armature, and a contact carrier connected to said armature, said armature being biased away from said electromagnet, a plurality of movable contacts resiliently connected to said contact carrier within said insulating enclosure having movable contact elements affixed thereto at opposite ends of said movable contacts, a pair of stationary contacts mounted in said insulating enclosure each having a plurality of stationary contact elements affixed thereon in alignment with respective said movable contact elements, said carrier being movable upon energization of said electromagnet to close said armature on said electromagnet and close said movable contact elements upon respective said stationary contact elements in plural parallel bridged current paths, said stationary contacts having rigid terminal portions extending externally of said insulating enclosure, said terminal portions being sufficiently sturdy to support a respective said switching device thereby; and means electrically and mechanically connecting said extending terminal portions directly to said heat sinks.

\* \* \* \* \*